US006359306B1

(12) United States Patent
Ninomiya

(10) Patent No.: US 6,359,306 B1
(45) Date of Patent: Mar. 19, 2002

(54) SEMICONDUCTOR DEVICE AND METHOD OF MANUFACTURING THEREOF

(75) Inventor: Hideaki Ninomiya, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/606,184

(22) Filed: Jun. 29, 2000

(30) Foreign Application Priority Data

Jun. 30, 1999 (JP) ............................................ 11-186546

(51) Int. Cl.[7] .......................... H01L 29/76; H01L 29/94; H01L 31/062; H01L 31/113; H01L 31/119; H01L 29/74; H01L 31/111
(52) U.S. Cl. ........................................ 257/328; 257/147
(58) Field of Search ................................ 257/328–334, 257/138–147; 438/212, 268, 259, 271, 587–589

(56) References Cited

U.S. PATENT DOCUMENTS 5,378,911 A * 1/1995 Murakami .................. 257/334
5,457,329 A * 10/1995 Harada ....................... 257/153
6,037,628 A * 3/2000 Huang ........................ 257/329

FOREIGN PATENT DOCUMENTS

EP 0 889 511 A2 1/1999
JP 10-150191 6/1998

OTHER PUBLICATIONS

T. Laska, et al. "1200V–Trench–IGBT Study with Square Short Circuit SOA," Proceedings of 1998 International Symposium on Power Semiconductor Devices & ICS, Jun. 3, 1998, pp. 433–436.
European Search Report.
Mitsuhiko Kitagawa et al., A 4500 V Injection Enhanced Insulated Gate Bipolar Transistor (IEGT) Operating in a Mode Similar to a Thyristor, May 12, 1993, pp. 28.3.1–28.4.3.
Saroshi Matsumoto et al., A High–Performance Self–Aligned UMOSFET With a Vertical Trench Contact Structure, May/1994.

* cited by examiner

Primary Examiner—Steven Loke
Assistant Examiner—Cuong Q Nguyen
(74) Attorney, Agent, or Firm—Oblon, Spivak, McClelland, Maier & Neustadt, P.C.

(57) ABSTRACT

In a method of manufacturing a trench-MOS gate structure device, trenches for contact and n-type source layers are alternately formed in a region situated between parallel trench-MOS gates. Thereby, scale down of the device is possible without requiring mask alignment.

15 Claims, 9 Drawing Sheets

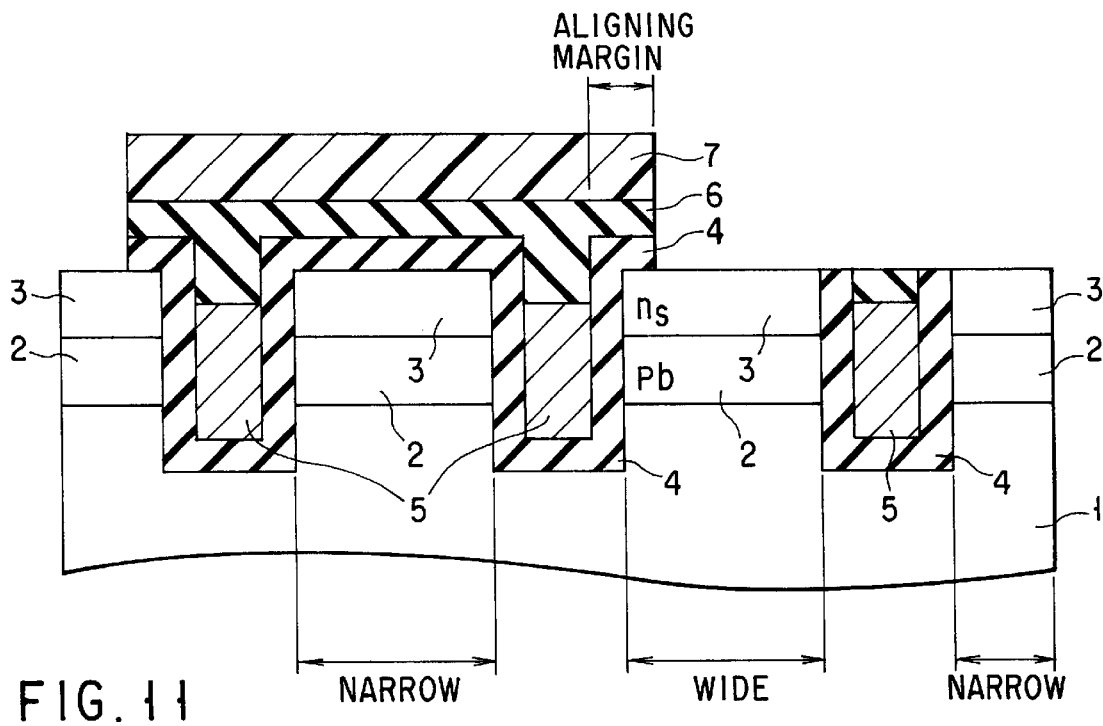
FIG. 11
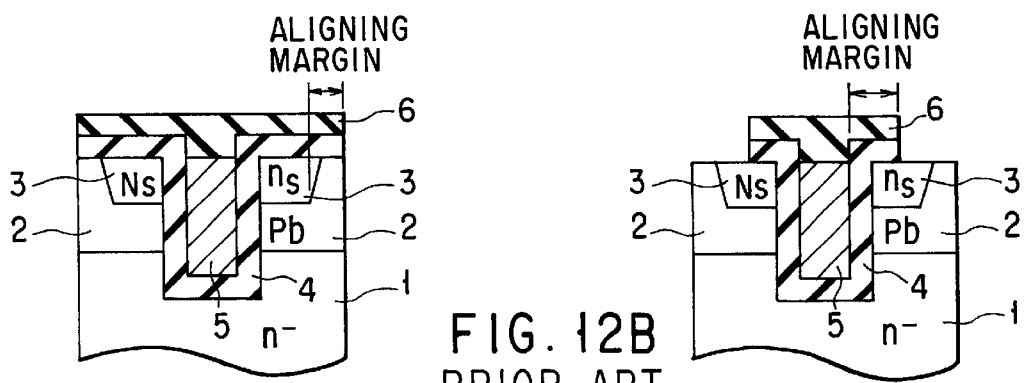
FIG. 12A PRIOR ART
FIG. 12B PRIOR ART
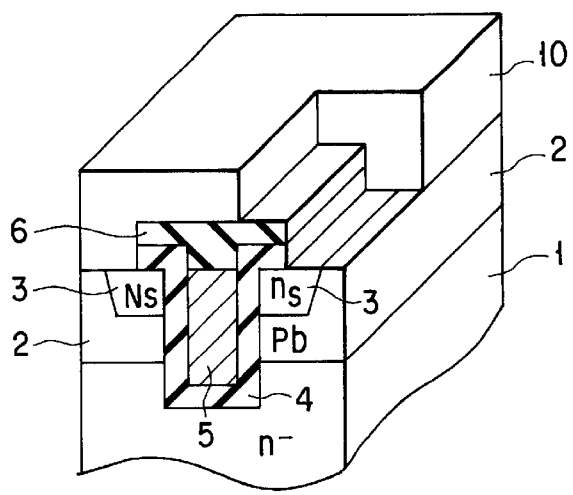
FIG. 12C PRIOR ART

SEMICONDUCTOR DEVICE AND METHOD OF MANUFACTURING THEREOF

CROSS-REFERENCE TO RELATED APPLICATIONS

This application is based upon and claims the benefit of priority from the prior Japanese Patent Application No. 11-186546, filed Jun. 30, 1999, the entire contents of which are incorporated herein by reference.

BACKGROUND OF THE INVENTION

The present invention relates to a semiconductor device and a method of manufacturing thereof.

FIGS. 12A–12C are drawings used for describing a process for manufacturing a conventional trench-MOS (Metal Oxide Semiconductor) gate structure. FIGS. 12A and 12B are cross-sectional views of a device of the trench-MOS gate structure in its manufacturing process, and FIG. 12C is a perspective view of the device.

In the conventional method of manufacturing, as shown in FIG. 12A, a p-type base layer 2 is formed by diffusion in a surface portion of an n-type high-resistance substrate 1, and then an n-type source layer 3 is selectively formed by diffusion in a surface portion of the p-type base layer 2. Thereafter, a trench for a MOS gate, which penetrates the n-type source layer 3 and the p-type base layer 2 and communicates with the n-type high-resistance substrate 1, is formed, and the entire surface of the substrate 1 including the trench is covered with a gate insulating film 4 (FIG. 12A). Thereafter, a gate electrode 5 is buried in the trench, and then an insulating film 6 is deposited to cover the gate electrode 5 (FIG. 12A). Thereafter, as shown in FIG. 12B, a contact window is formed and then, as shown in FIG. 12C, a MOS gate structure is formed by forming an emitter electrode 10 on the surface of the substrate 1. In the process of manufacturing the trench-MOS gate structure, a margin for mask alignment was required as shown in FIG. 12A, so that the emitter electrode 10 and the p-type base layer 2 are connected. Further, as shown in FIG. 12B, it was necessary to provide a margin for mask alignment in order to prevent short circuit between the gate electrode 5 and the emitter electrode 10. Since there were these alignment margins, scale down of the device was difficult, and property improvement such as reduction of the on-state resistance was difficult.

As described above, in a process of manufacturing a semiconductor device having a conventional trench gate structure, it was necessary to provide margins for aligning masks for formation of trench, n-type source layer and contact window. Therefore, there was the problem that scale down of the device structure was restricted by the margins for mask alignment.

BRIEF SUMMARY OF THE INVENTION

The present invention has been made in consideration of such circumstances, and has its object to provide a semiconductor device and a method of manufacturing thereof, which enables scale down of a device structure.

Therefore, in order to solve the above problem, the present invention is characterized in that mask alignment is unnecessary, scale down is possible and device property is improved by alternately forming trenches and source layers for contact in a region between parallel trench gates.

Specifically, according to a first aspect of the present invention, there is provided a semiconductor device comprising:

a first conductivity-type base layer;

a second conductivity-type base layer formed on the first conductivity-type base layer;

a first conductivity-type source layer formed on the second conductivity-type base layer;

a plurality of first trenches formed in parallel to each other, which penetrate from a surface of the first conductivity-type source layer through the first conductivity-type source layer and the second conductivity-type base layer and reach the first conductivity-type base layer;

gate insulating films formed on wall surfaces of the first trenches;

gate electrodes formed within the first trenches and on the second conductivity-type base layer via the gate insulating films;

a plurality of second trenches which penetrate from the surface of the first conductivity-type source layer through the first conductivity-type source layer and reach the second conductivity-type base layer; and a first main electrode formed within the second trenches and electrically connected to the first conductivity-type source layer and the second conductivity-type base layer, wherein portions of the second trenches and portions of the first conductivity-type source layer are alternately arranged in regions among the first trenches.

In the semiconductor device according to the first aspect of the present invention, the semiconductor device may further comprise second conductivity-type contact layers formed in surface portions of the second conductivity-type base layer defining the second trenches, the second conductivity-type contact layers having an impurity concentration higher than the second conductivity-type base layer.

In the semiconductor device according to the first aspect of the present invention, the semiconductor device may further comprise second conductivity-type contact layers formed in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

According to a second aspect of the present invention, there is provided a semiconductor device comprising:

a first conductivity-type base layer;

a second conductivity-type base layer formed on the first conductivity-type base layer;

a first conductivity-type source layer formed on the second conductivity-type base layer;

a plurality of first trenches formed in parallel to each other, which penetrate from a surface of the first conductivity-type source layer through the first conductivity-type source layer and the second conductivity-type base layer and reach the first conductivity-type base layer;

gate insulating films formed on wall surfaces of the first trenches;

gate electrodes formed within the first trenches and on the second conductivity-type base layer via the gate insulating films;

a plurality of second trenches which penetrate from the surface of the first conductivity-type source layer through the first conductivity-type source layer and reach the second conductivity-type base layer;

a first main electrode formed within the second trenches and electrically connected to the first conductivity-type source layer and the second conductivity-type base layer;

a high impurity concentration base layer and a second conductivity-type collector layer superposed on a surface of the first conductivity-type base layer, which surface is opposed to a surface thereof on which the second conductivity-type base layer is formed, the high impurity concentration base layer having an impurity concentration higher than the first conductivity-type base layer and being of the first conductivity-type; and a second main electrode formed on the second conductivity-type collector layer, wherein portions of the second trenches and portions of the first conductivity-type source layer are alternately arranged in regions among the first trenches.

In the semiconductor device according to the second aspect of the present invention, the semiconductor device may further comprise second conductivity-type contact layers formed in surface portions of the second conductivity-type base layer defining the second trenches, the second conductivity-type contact layers having an impurity concentration higher than the second conductivity-type base layer.

In the semiconductor device according to the second aspect of the present invention, the semiconductor device may further comprise second conductivity-type contact layers formed in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

According to a third aspect of the present invention, there is provided a semiconductor device comprising:

a first conductivity-type base layer;

a second conductivity-type base layer formed on the first conductivity-type base layer;

a first conductivity-type source layer formed on the second conductivity-type base layer;

a plurality of first trenches formed in parallel to each other, which penetrate from a surface of the first conductivity-type source layer through the first conductivity-type source layer and the second conductivity-type base layer and reach the first conductivity-type base layer;

gate insulating films formed on wall surfaces of the first trenches;

gate electrodes formed within the first trenches and on the second conductivity-type base layer via the gate insulating films;

a plurality of second trenches which penetrate from the surface of the first conductivity-type source layer through the first conductivity-type source layer and reach the second conductivity-type base layer;

a first main electrode formed within the second trenches and electrically connected to the first conductivity-type source layer and the second conductivity-type base layer, a drain layer formed on a surface of the first conductivity-type base layer, which surface is opposed to a surface thereof on which the second conductivity-type base layer is formed, the drain layer having an impurity concentration higher than the first conductivity-type base layer and being of the first conductivity-type; and a second main electrode formed on the drain layer, wherein portions of the second trenches and portions of the first conductivity-type source layer are alternately arranged in regions among the first trenches.

In the semiconductor device according to the third aspect of the present invention, the semiconductor device may further comprise second conductivity-type contact layers formed in surface portions of the second conductivity-type base layer defining the second trenches, the second conductivity-type contact layers having an impurity concentration higher than the second conductivity-type base layer.

In the semiconductor device according to the third aspect of the present invention, the semiconductor device may further comprise second conductivity-type contact layers formed in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

According to a fourth aspect of the present invention, there is provided a semiconductor device comprising:

a first conductivity-type base layer;

a second conductivity-type base layer formed on the first conductivity-type base layer;

a first conductivity-type source layer formed on the second conductivity-type base layer;

a plurality of first trenches formed in parallel to each other, which penetrate from a surface of the first conductivity-type source layer through the first conductivity-type source layer and the second conductivity-type base layer and reach the first conductivity-type base layer;

gate insulating films formed on wall surfaces of the first trenches;

gate electrodes formed within the first trenches and on the second conductivity-type base layer via the gate insulating films;

a plurality of second trenches which penetrate from the surface of the first conductivity-type source layer through the first conductivity-type source layer and reach the second conductivity-type base layer;

a first main electrode formed within the second trenches and electrically connected to the first conductivity-type source layer and the second conductivity-type base layer;

a high impurity concentration base layer formed on the first conductivity-type base layer, the high impurity concentration base layer being separated from the second conductivity-type base layer, the high impurity concentration base layer having an impurity concentration higher than the first conductivity-type base layer and being of the first conductivity-type;

a second conductivity-type collector layer formed on the high impurity concentration base layer; and a second main electrode formed on the second conductivity-type collector layer, wherein portions of the second trenches and portions of the first conductivity-type source layer are alternately arranged in regions among the first trenches.

In the semiconductor device according to the fourth aspect of the present invention, the semiconductor device may further comprise second conductivity-type contact layers formed in surface portions of the second conductivity-type base layer defining the second trenches, the second conductivity-type contact layers having an impurity concentration higher than the second conductivity-type base layer.

In the semiconductor device according to the fourth aspect of the present invention, the semiconductor device may further comprise second conductivity-type contact layers formed in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

According to a fifth aspect of the present invention, there is provided a semiconductor device comprising:

a first conductivity-type base layer;

a second conductivity-type base layer formed on the first conductivity-type base layer;

a first conductivity-type source layer formed on the second conductivity-type base layer;

a plurality of first trenches formed in parallel to each other, which penetrate from a surface of the first conductivity-type source layer through the first conductivity-type source layer and the second conductivity-type base layer and reach the first conductivity-type base layer;

gate insulating films formed on wall surfaces of the first trenches;

gate electrodes formed within the first trenches and on the second conductivity-type base layer via the gate insulating films;

a plurality of second trenches which penetrate from the surface of the first conductivity-type source layer through the first conductivity-type source layer and reach the second conductivity-type base layer;

a first main electrode formed within the second trenches and electrically connected to the first conductivity-type source layer and the second conductivity-type base layer;

a drain layer formed on the first conductivity-type base layer, the drain layer being separated from the second conductivity-type base layer, the drain layer having an impurity concentration higher than the first conductivity-type base layer and being of the first conductivity-type; and a second main electrode formed on the drain layer, wherein portions of the second trenches and portions of the first conductivity-type source layer are alternately arranged in regions among the first trenches.

In the semiconductor device according to the fifth aspect of the present invention, the semiconductor device may further comprise second conductivity-type contact layers formed in surface portions of the second conductivity-type base layer defining the second trenches, the second conductivity-type contact layers having an impurity concentration higher than the second conductivity-type base layer.

In the semiconductor device according to the fifth aspect of the present invention, the semiconductor device may further comprise second conductivity-type contact layers formed in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

According to a sixth aspect of the present invention, there is provided a method of manufacturing a semiconductor device, comprising the steps of:

forming a plurality of first trenches for gates in parallel to each other on a semiconductor substrate;

forming gate insulating films within the first trenches;

forming gate electrodes within the first trenches and on the gate insulating films;

forming an interlayer insulating film on an entire surface of the semiconductor substrate including the gate electrodes;

removing a portion of the interlayer insulating film, which is on the semiconductor substrate, with portions of the interlayer insulating film on the gate electrodes being left; and forming a plurality of second trenches for contact, with the left portions of the interlayer insulating film and resist patterns used as masks, wherein the second trenches are formed at a predetermined interval at surface regions of the semiconductor substrate, which are located between the first trenches.

In the method of manufacturing a semiconductor device, according to the sixth aspect of the present invention, the manufacturing method may further comprise the step performed succeeding to the step of forming the plurality of second trenches for contact, of performing an impurity implantation to form second conductivity-type contact layers in surface portions of the second conductivity-type base layer defining the second trenches, the second conductivity-type contact layers having an impurity concentration higher than the second conductivity-type base layer.

In the method of manufacturing a semiconductor device, according to the sixth aspect of the present invention, the manufacturing method may further comprise the step performed succeeding to the step of forming the plurality of second trenches for contact, of removing the resist patterns, and the step performed succeeding to the step of removing the resist patterns, of performing an impurity implantation to form second conductivity-type contact layers in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

According to the present invention, since a trench-MOS gate structure can be formed without mask alignment, scale down of the device is possible and the device property is improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are cross-sectional views of a device of a trench-MOS gate structure in a process of manufacturing the device, and FIGS. 1C and 1D are perspective views of the device.

FIGS. 3A, 3B and 3C are cross-sectional views of a device of a trench-MOS gate structure in a process of manufacturing the device.

FIG. 11 is a drawing used for describing a ninth embodiment of the present invention, which is a cross-sectional view of a device of a trench-MOS gate structure in a process of manufacturing the device.

FIGS. 12A, 12B and 12C are drawings used for describing a process for manufacturing a semiconductor device of a conventional trench-MOS gate structure. FIGS. 12A and 12B are cross-sectional views of the device of the trench-MOS gate structure in the process for manufacturing the device, and FIG. 12C is a perspective view of the device.

DETAILED DESCRIPTION OF THE INVENTION

Embodiments of the present invention will now be described with reference to the drawings.

Figure 1A:
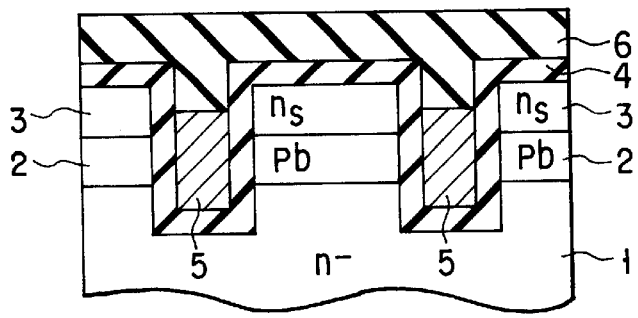
FIGS. 1A, 1B, 1C and 1D are drawings used for describing a first embodiment of the present invention.
Figure 1B:
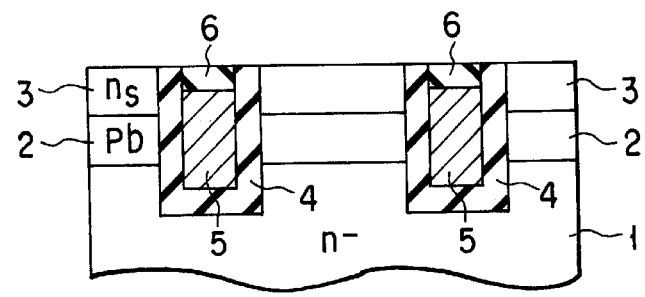
Figure 1C:
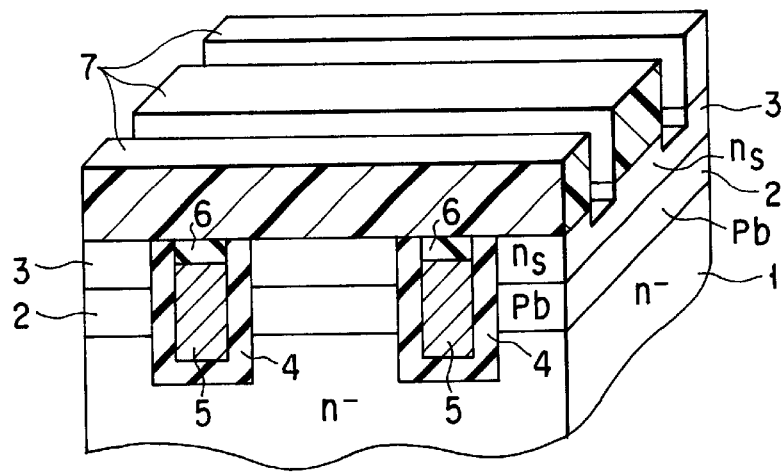
Figure 1D:
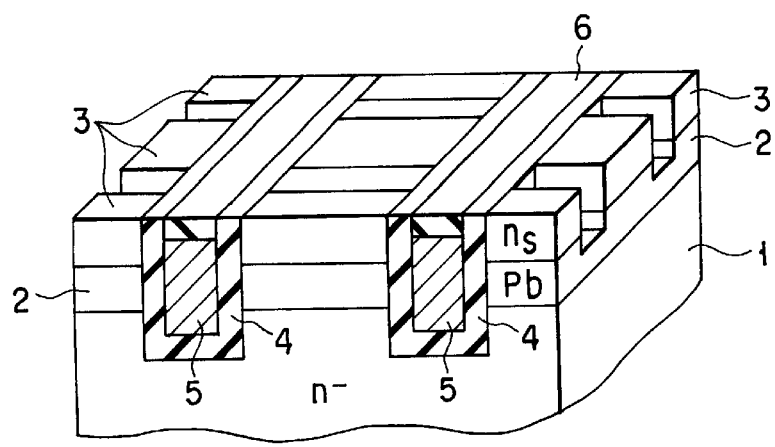

A first embodiment of the present invention will now be described with reference to FIGS. 1A–1D. FIGS. 1A and 1B are cross-sectional views of a device of a trench-MOS gate structure in a process of manufacturing the device, and FIGS. 1C and 1D are perspective views of the device. The process is different from the conventional manufacturing process shown in FIGS. 12A–12C in that an n-type source layer 3 is formed by diffusion on a p-type base layer 2 without mask alignment, that is, the source layer 3 is formed in an entire surface region of the p-type base layer 2, and that gate electrodes 5 are deeply buried in trenches, that is, upper surfaces of the gate electrodes 5 are situated in a deeper position of the substrate surface (FIG. 1A).

The process of manufacturing the device will now be described with reference to FIGS. 1A–1D. A p-type base layer 2 is formed by diffusing impurities a surface portion of an n-type high-resistance substrate 1, and then an n-type source layer 3 is formed by diffusing impurities in an entire surface portion of the p-type base layer 2. Thereafter, trenches for MOS gates, which penetrate the n-type source layer 3 and the p-type base layer 2 and communicate with the n-type high-resistance substrate 1, are formed, and then the entire surface of the substrate 1 including the trenches is covered with a gate insulating film 4. Thereafter, gate electrodes 5 are buried in the trenches, and then an insulating film 6 is deposited to cover the gate electrodes 5 (FIG. 1A). Thereafter, the insulating film 6 and the gate insulating film 4 on the surface of the substrate 1 are etched and removed by using RIE (reactive ion etching) or CMP (chemical mechanical polishing), etc. until a surface of the n-type source layer 3 is exposed (FIG. 1B). Then, a plurality of resist patterns 7 are formed on the surface of the substrate 1 (FIG. 1C). Thereafter, by using the resist patterns 7 as masks, the n-type source layer 3 and p-type base layer 2 are selectively etched by using, for example, RIE, to form a plurality of trenches for contact in the n-type source layer 3 and p-type base layer 2, which extend perpendicular to the gate electrodes 5 (FIG. 1D). As is clear from the above description of the manufacturing process, when a trench gate structure is formed by using the method of the embodiment, patterning is required twice, that is, one time when forming the trenches for trench gates, and one time when forming the trenches for trench contacts. However, since no pattern alignment is required, scale down of the device is enabled and the device property is improved.

Figure 2:
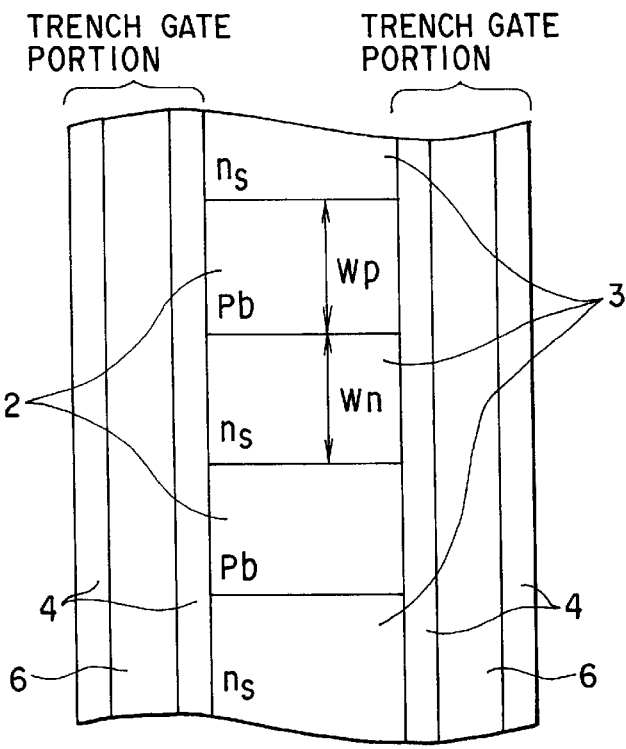
FIG. 2 is an enlarged plan view of a part of a top surface of the device shown in FIG. 1D.

FIG. 2 is an enlarged plan view of a part of the device shown in FIG. 1D. Trench gates are formed in parallel to each other, as shown in the plan view of FIG. 2. Each of the trench gates includes the gate insulating film 4 and insulating film 6. In a region between the trench gates formed in parallel, portions wherein trenches for trench contact are formed at the n-type source layer 3 and the p-type base layer is seen through the trenches, and portions wherein no trench for trench contact is formed and the n-type source layer 3 itself is seen are alternately situated. That is, the portions of the p-type base layer 2 and the portions of n-type source layer 3 are alternately arranged, as shown in the plan view of FIG. 2. Each of the portions of the p-type base layer 2 in the alternating direction of the portions of the p-type base layer 2 and the portions of the n-type source layer 3 is denoted by Wp. In other words, Wp denotes a width of a trench of the trench contact in the direction of alternate arrangement of the portions of the p-type base layer 2 and the portions of the n-type source layer 3. Similarly, each of the portions of the n-type source layer 3 in the alternating direction of the portions of the p-type base layer 2 and the portions of the n-type source layer 3 is denoted by Wn. A channel density of the trench-MOS gate can be changed by changing a ratio of the width Wp of the portion of the p-type base layer 2 to the width Wn of the portion of the n-type source layer 3. When the value of Wp/Wn is enlarged, the channel density is reduced. On the other hand, when the value of Wp/Wn is reduced, the channel density is enlarged. When the channel density is reduced (that is, the rate of Wp is enlarged), a saturation current of the MOS gate can be reduced, and therefore the latch-up withstand level and load short-circuit withstand level can be increased. In contrast with this, when the channel density is enlarged (that is, the rate of Wn is enlarged), the on-state resistance of the MOS gate is reduced, and the current loss of the device can be reduced.

Figure 3A:
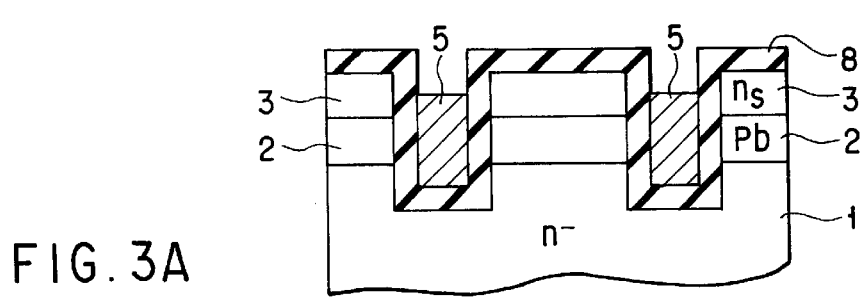
FIGS. 3A, 3B and 3C are drawings used for describing a second embodiment of the present invention.
Figure 3B:
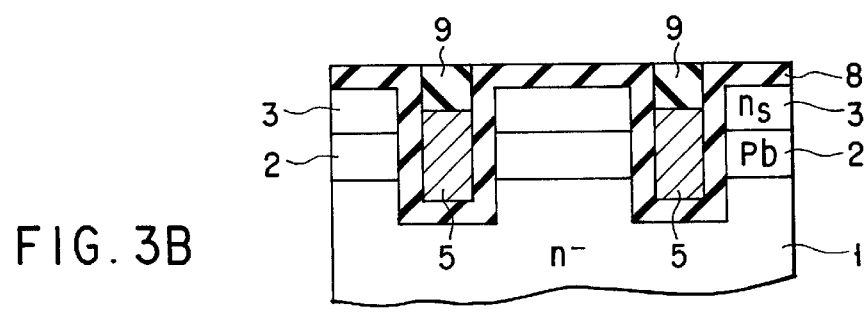
Figure 3C:
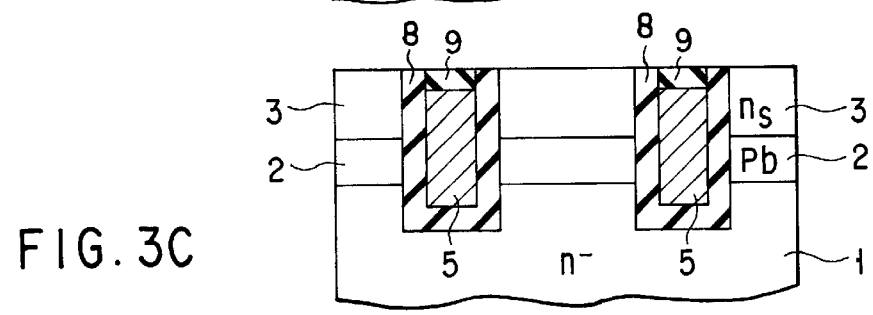

A second embodiment of the present invention will now be described with reference to FIGS. 3A–3C. FIGS. 3A–3C are cross-sectional views of a device of a trench-MOS gate structure in a process of manufacturing the device. This embodiment is different from the first embodiment shown in FIGS. 1A–1D in that an ONO film (a laminated film having a three-layer structure wherein a silicon nitride film is held between silicon oxide films) 8 is used (FIG. 3A) as the gate insulating film and that it is unnecessary to deposit an insulating film 6 (FIG. 3B). The reason why it is unnecessary to deposit an insulating film 6 is that, in this embodiment, the semiconductor substrate is oxidized after forming the gate electrodes 5 so that thick silicon oxide films 9 are grown on the gate electrodes 5. At this time, no oxide film is grown on the ONO film 8. In FIGS. 3A–3C, the ONO film 8 is shown in the form of a single layer for simplification of the drawings.

The process for manufacturing the device will be described with reference to FIGS. 3A–3C. A p-type base layer 2 is formed by impurity diffusion in a surface portion of an n-type high-resistance substrate 1, and then an n-type source layer 3 is formed by impurity diffusion in an entire surface portion of the p-type base layer 2. Thereafter, trenches for MOS gates, which penetrate the n-type source layer 3 and p-type base layer 2 and communicate with the n-type high-resistance substrate 1, are formed, and then the surface of the substrate 1 including the trench is covered with an ONO film 8 serving as a gate insulating film. Then, gate electrodes 5 are buried in the trenches (FIG. 3A). Thereafter, the substrate is oxidized and thick silicon oxide films 9 are grown on the gate electrodes 5 to cover the gate electrodes 5 (FIG. 3B). Then, the silicon oxide films 9 and the ONO film 8 on the surface of the substrate 1 are etched and removed by using RIE and CMP, etc. until the surface of the n-type source layer 3 is exposed (FIG. 3C).

The following process is the same as in the first embodiment described with reference to FIGS. 1C and 1D. Specifically, a plurality of resist patterns 7 are formed on the surface of the substrate 1 (FIG. 1C). Thereafter, by using these resist patterns 7 as masks, the n-type source layer 3 and p-type base layer 2 are selectively etched by using, for example, RIE, to form a plurality of trenches for contact in the n-type source layer 3 and p-type base layer 2, which extend perpendicular to the gate electrodes 5 (FIG. 1D). In the method of this embodiment, pattern alignment is also unnecessary as in the first embodiment. Therefore, scale down of the device is possible and the device property is improved.

Figure 4:
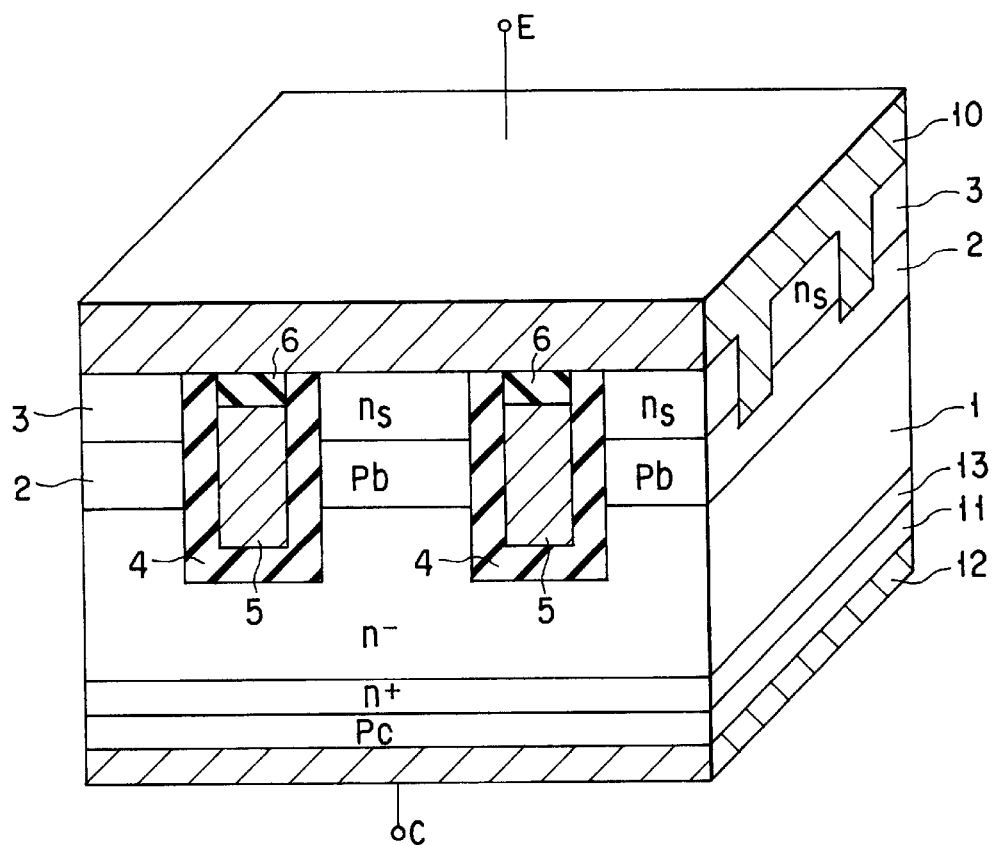
FIG. 4 is a drawing used for a third embodiment of the present invention, which is a perspective view of a vertical IGBT.

A third embodiment of the present invention will now be described with reference to FIG. 4. FIG. 4 is a perspective view of a vertical IGBT. The vertical IGBT (Insulated Gate Bipolar Transistor) in FIG. 4 uses the trench-MOS gate structure of the present invention. On a surface of a substrate 1 on the side provided with trench gate electrodes 5, an emitter electrode 10 connected with an n-type source layer 3 and p-type base layer 2 is formed. Further, an n-type buffer layer 13 is formed by impurity diffusion in a surface portion on the opposite side of the substrate. A p-type collector layer 11 is formed by impurity diffusion in a surface portion of the n-type buffer layer 13, and a collector electrode 12 is formed on, and connected to, the p-type collector layer 11. As shown in FIG. 4, when the trench-MOS gate structure of the present invention is applied to a vertical IGBT, scale down of the device on the side of the emitter electrode 10 is possible and thus the channel density of the MOS gate can be increased. Accordingly, the on-state resistance of the device can be lowered.

Figure 5A:
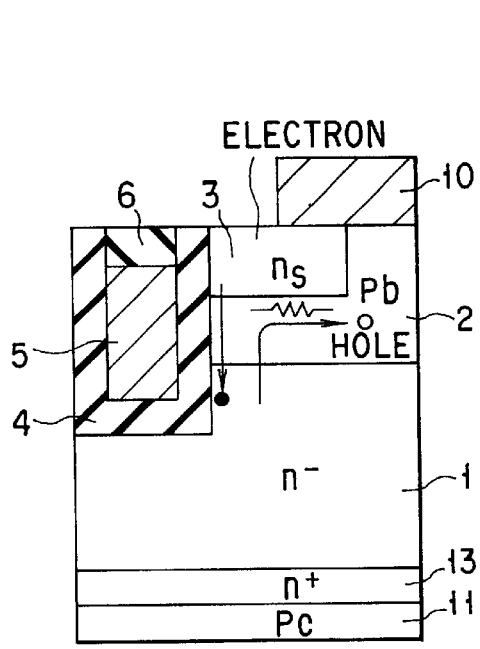
FIG. 5A is a cross-sectional view of an IGBT structured by applying the conventional trench gate structure used in FIG. 12, and a drawing used for describing an operation of the IGBT.
Figure 5B:
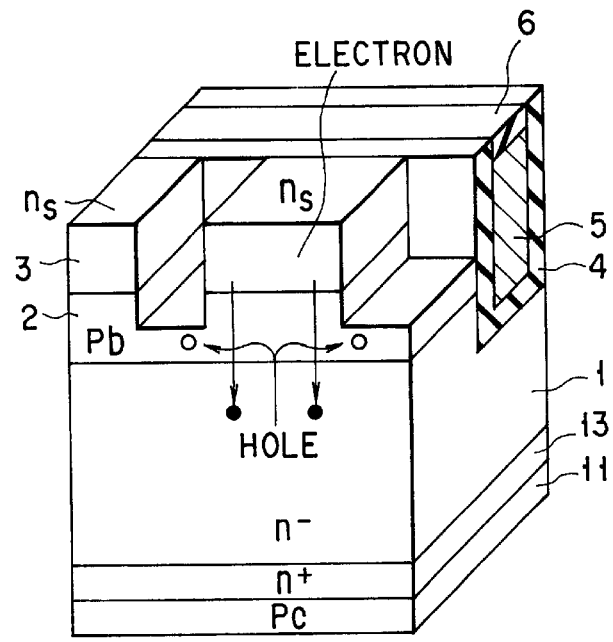
FIG. 5B is a perspective view of an IGBT structured by using the process of the present invention, viewed from a cross section in a direction parallel to the trench gates, and a drawing used for explaining an operation of the IGBT.

FIG. 5A is a cross-sectional view of an IGBT structured by applying the conventional trench gate structure used in FIGS. 12A–12C, and a drawing used for describing its operation. FIG. 5B is a perspective view of an IGBT structured by using the process of the present invention, viewed from a cross section in a direction parallel to the trench gates, and a drawing used for describing its operation.

In the IGBT element shown in FIG. 5A using the conventional trench gate structure, when the device is in an on-state, electrons pass through the side walls of the trench gates and flows from the n-type source layer 3 to the n-type high-resistance substrate 1, and holes run from the n-type high-resistance substrate 1 to the p-type base layer 2 and flow to the emitter electrode 10. At this time, holes once approach the trench side wall through which electrons run, and pass under the n-type source layer 3 and are then discharged to the emitter electrode 10. Therefore, when a hole current increases, a potential of a part under the n-type source layer 3 rises by diffusion resistance components of the p-type base layer 2. At the time when the potential exceeds a built-in voltage (approximately 0.7V) of a PN diode formed by the p-type base layer 2 and the n-type source layer 3, the electrons flow regardless of control by the trench gates, and the electrons serve as a base current, which causes a latch-up phenomenon wherein holes flow from the p-type collector layer 11 to the p-type base layer 2.

On the other hand, in the case of using the IGBT shown in FIG. 5B using the process of the present invention, holes do not pass through a part under the n-type source layer 3, but are discharged to the emitter electrode 10 along the trench side wall. Therefore, no latch-up occurs even when the hole current increases, and a larger current can be controlled.

Figure 6:
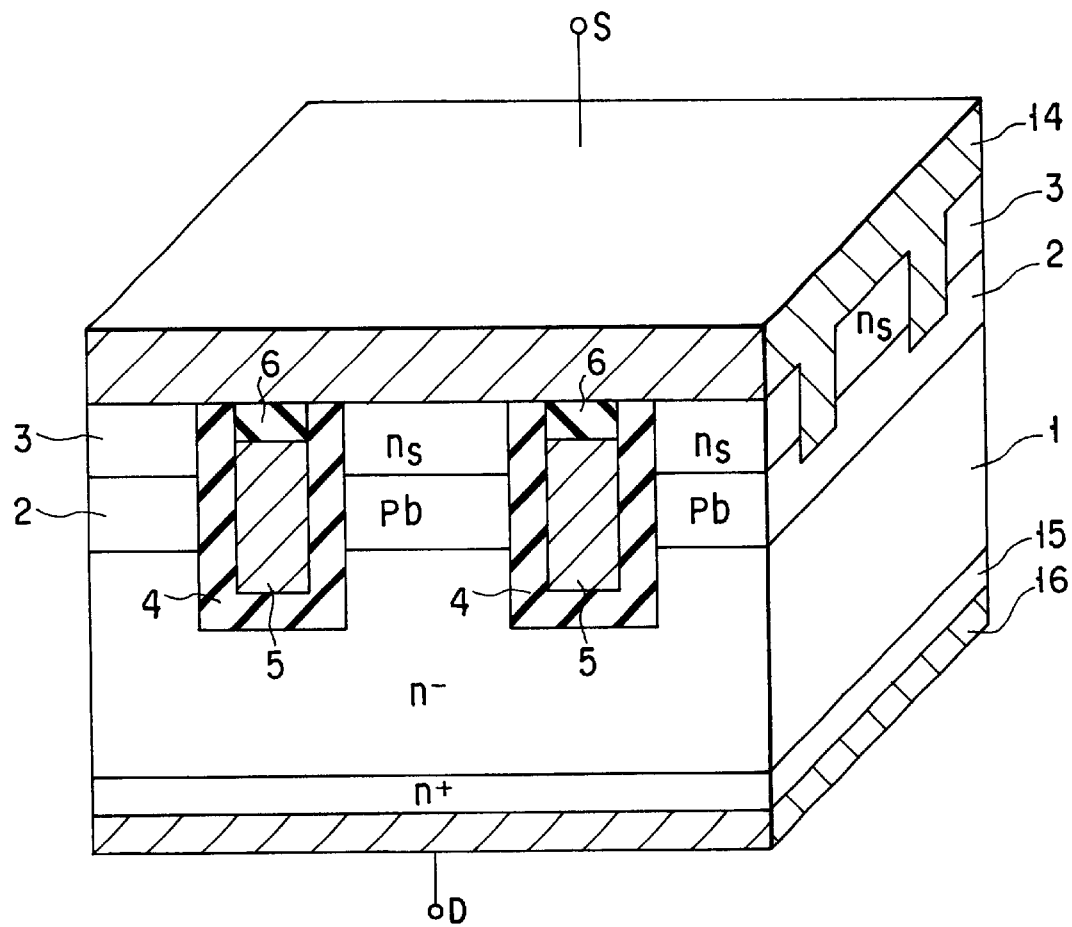
FIG. 6 is a drawing used for describing a fourth embodiment of the present invention, which is a perspective view of a vertical MOSFET.

A fourth embodiment of the present invention will now be described with reference to FIG. 6. FIG. 6 is a perspective view of a vertical MOSFET. In FIG. 6, the trench-MOS gate structure of the present invention is used for the vertical MOSFET. On a surface of substrate 1 on the side provided with the trench gate electrodes 5, a source electrode 14 connected with an n-type source layer 3 and a p-type base layer 2, and in the substrate surface portion on the opposite side, an n-type drain layer 15 is formed by impurity diffusion. A drain electrode 16 is formed on the n-type drain layer 15 and connected to the drain layer 15. In the vertical MOSFET shown in FIG. 6, since the trench-MOS gate structure of the present invention is applied thereto, scale down of the device on the side of the source electrode 14 is possible and the channel density of the MOS gate can be increased. Therefore, the on-state resistance of the device can be lowered.

Figure 7:
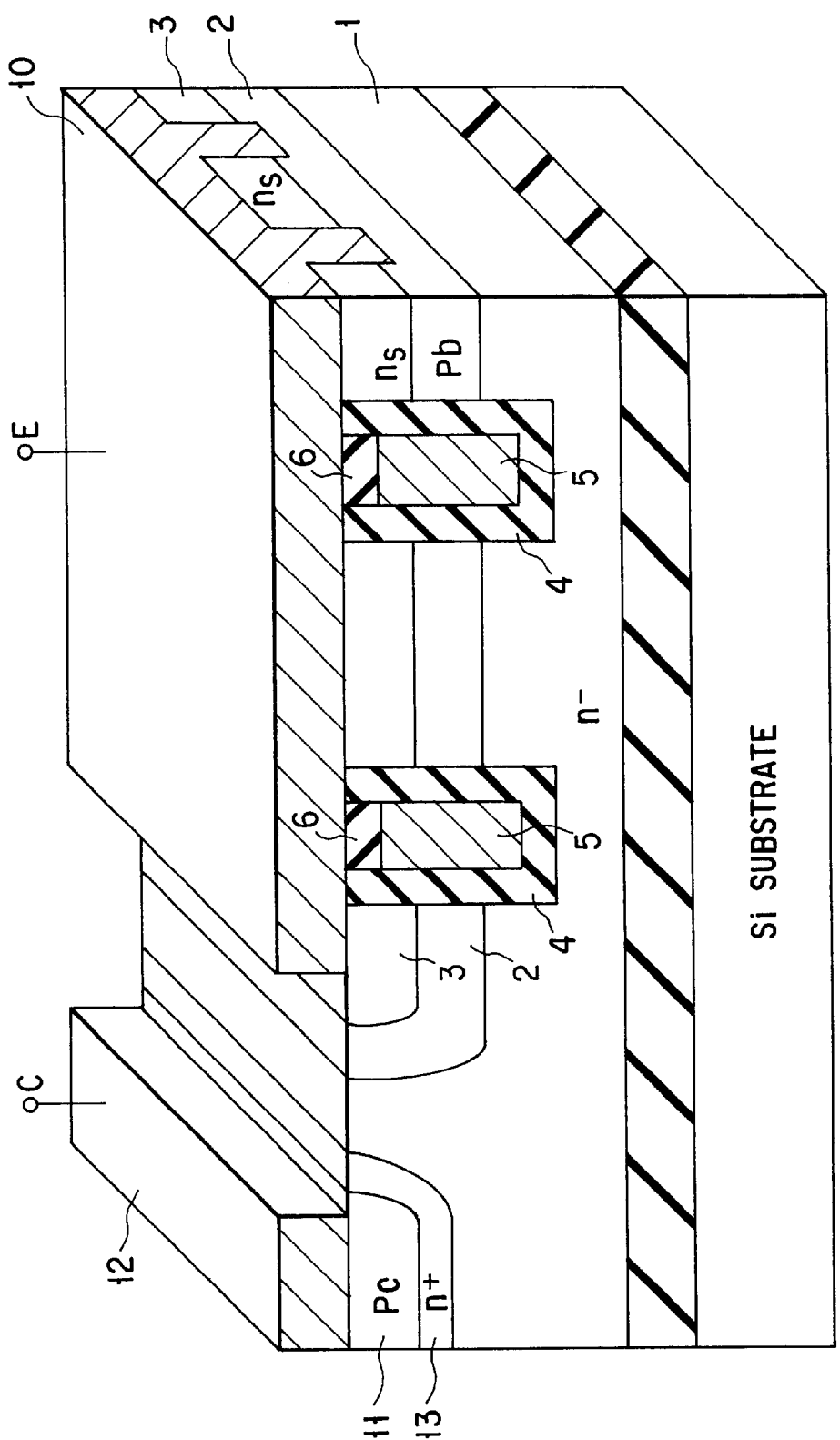
FIG. 7 is a drawing used for describing a fifth embodiment of the present invention, which is a perspective view of a lateral IGBT.

A fifth embodiment of the present invention will now be described with reference to FIG. 7. FIG. 7 is a perspective view of a lateral IGBT. The lateral IGBT in FIG. 7 uses the trench-MOS gate structure of the present invention. On a surface of an n-type high-resistance substrate 1, an emitter electrode 10 connected to an n-type source layer 3 and p-type base layer 2 is formed. An n-type buffer layer 13 and p-type collector layer 11 are selectively formed by impurity diffusion in the surface portion of the n-type high-resistance substrate 1. A collector electrode 12 is formed on the p-type collector layer 11. When the trench-MOS gate structure of the present invention is applied to a lateral IGBT, as shown in FIG. 7, scale down of the device on the emitter electrode 10 side is possible and the channel density of the MOS gate can be increased. Therefore, the on-state resistance of the device can be lowered. Further, a latch-up withstand level can be enlarged as shown in FIG. 5B.

Figure 8:
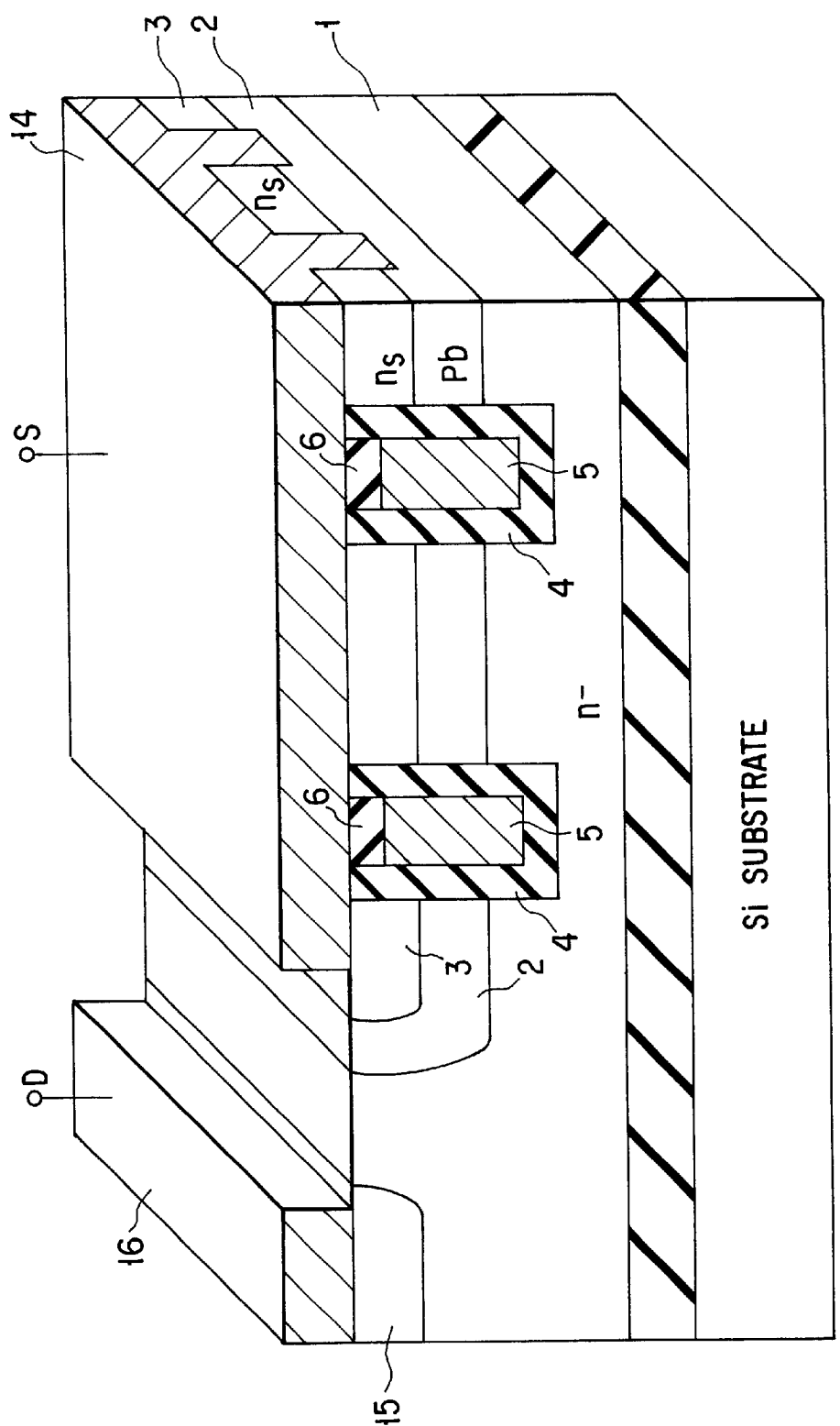
FIG. 8 is a drawing used for describing a sixth embodiment of the present invention, which is a perspective view of a lateral MOSFET.

A sixth embodiment of the present invention will now be described with reference to FIG. 8. FIG. 8 is a perspective view of a lateral MOSFET. The lateral MOSFET of FIG. 8 uses the trench-MOS gate structure of the present invention. A source electrode 14 connected to an n-type source layer 3 and a p-type base layer 2 are formed on a surface of an n-type high-resistance substrate 1, and an n-type drain layer 15 is selectively formed by impurity diffusion in the surface portion of the n-type high-resistance substrate 1. A drain electrode 16 is formed on the n-type drain layer 15. As shown in FIG. 8, when the trench-MOS gate structure of the present invention is applied to a lateral MOSFET, scale down of the device on the side of the source electrode 14 is possible, and the channel density of the MOS gate can be heightened. Therefore, the on-state resistance of the device can be lowered.

Figure 9A:
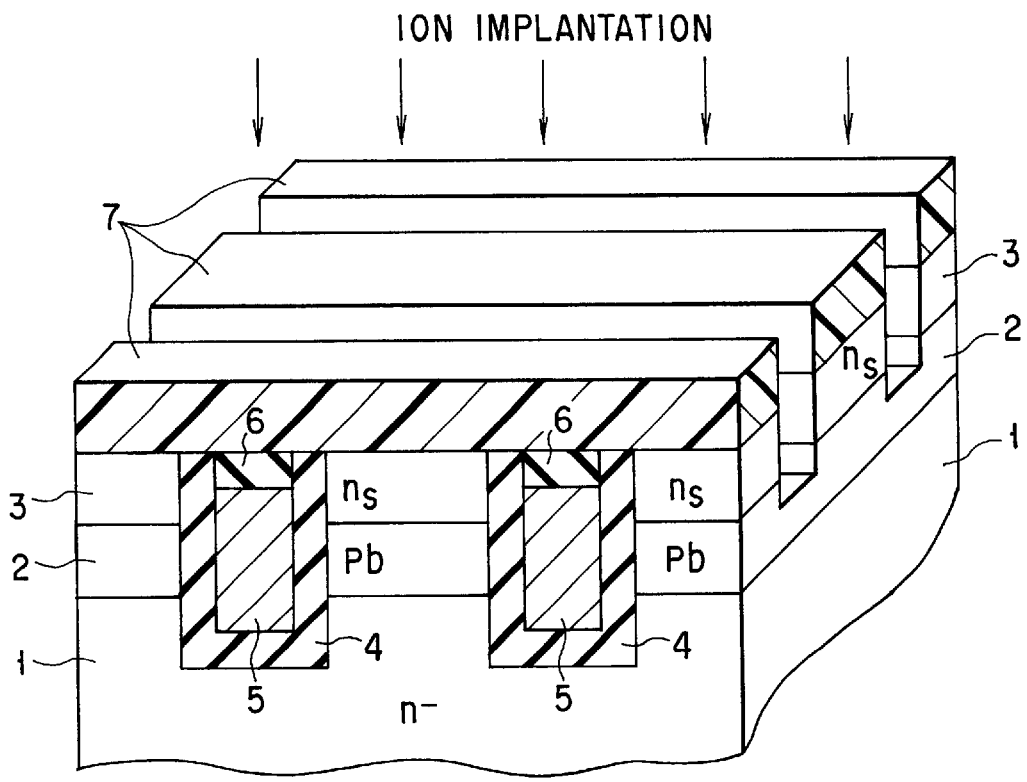
FIGS. 9A and 9B are drawings used for describing a seventh embodiment of the present invention, which are perspective views of a device of a trench-MOS gate structure in a process of manufacturing the device.
Figure 9B:
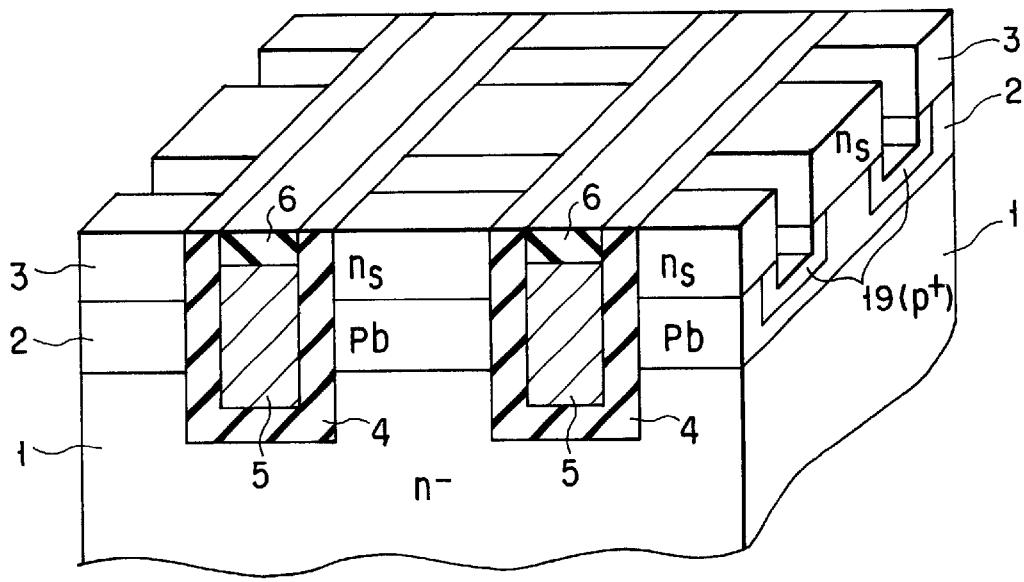

A seventh embodiment of the present invention will now be described with reference to FIGS. 9A and 9B. FIGS. 9A and 9B are perspective views of a device of a trench-MOS gate structure in a process of manufacturing the device.

First, the semiconductor structure shown in FIG. 1B referred to in the explanation of the first embodiment is formed. Specifically, a p-type base layer 2 is formed by impurity diffusion in a surface portion of an n-type high-resistance substrate 1, and an n-type source layer 3 is formed by impurity diffusion in an entire surface portion of the p-type base layer 2 (refer to FIG. 1A). Then, trenches for MOS gates, which penetrate the n-type source layer 3 and p-type base layer 2 and communicate with the n-type high-resistance substrate 1 are formed, and then the entire surface of the substrate 1 including the trench is covered with a gate insulating film 4 (refer to FIG. 1A). Thereafter, gate electrodes 5 are buried in the trench, and then an insulating film 6 is deposited to cover the gate electrodes 5 (refer to FIG. 1A). Thereafter, the insulating film 6 and the gate insulating film 4 on the surface of the substrate 1 is etched and removed by using RIE and CMP, etc. until the surface of the n-type source layer 3 is exposed (refer to FIG. 1B).

Thereafter, in the same manner as stated with respect to the first embodiment with reference to FIG. 1C, a plurality of resist patterns 7 are formed on the surface of the substrate 1, as shown in FIG. 9A (which is the same as FIG. 1C). Then, by using these resist patterns 7 as masks, the n-type source layer 3 and p-type base layer 2 are selectively etched by using, for example, RIE, to form a plurality of trenches for contact in the n-type source layer 3 and p-type base layer 2, which extend perpendicular to the gate electrodes 5 (FIG. 1D).

In the seventh embodiment, then, boron is ion-implanted, with resist patterns 7 used as masks (FIG. 9A). Thereafter, resist patterns 7 are removed, and by performing high temperature annealing, p-type contact layers 19 are formed in surface regions of the trenches for contact of the p-type base layer 2, as shown in FIG. 9B. The p-type contact layers 19 have an impurity concentration higher than the p-type base layer 2. Then, though not shown in FIG. 9B, as shown in FIG. 4, an emitter electrode 10 is formed on the surface of the substrate 1. In the seventh embodiment, by forming a p-type contact layer 19, the contact resistance between the emitter electrode 10 and the p-type base layer 2 is reduced. Therefore, when this structure is used for an IGBT, since discharge resistance of holes can be reduced, latch-up withstand level can be improved. The technique that p-type contact layers 19 are formed in surface regions of the trenches for contact of the p-type base layer 2, as shown in FIG. 9B, can be applied to all of the embodiments of the present invention.

Figure 10A:
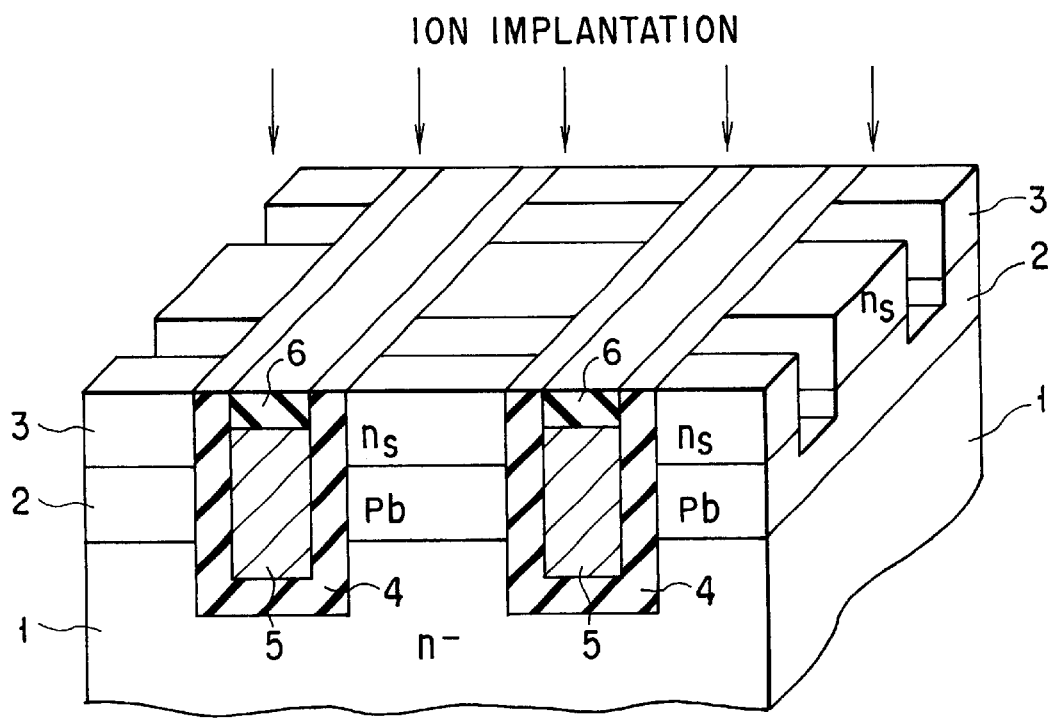
FIGS. 10A and 10B are drawings used for describing an eighth embodiment of the present invention, which are perspective views of a device of a trench-MOS gate structure in a process of manufacturing the device.
Figure 10B:
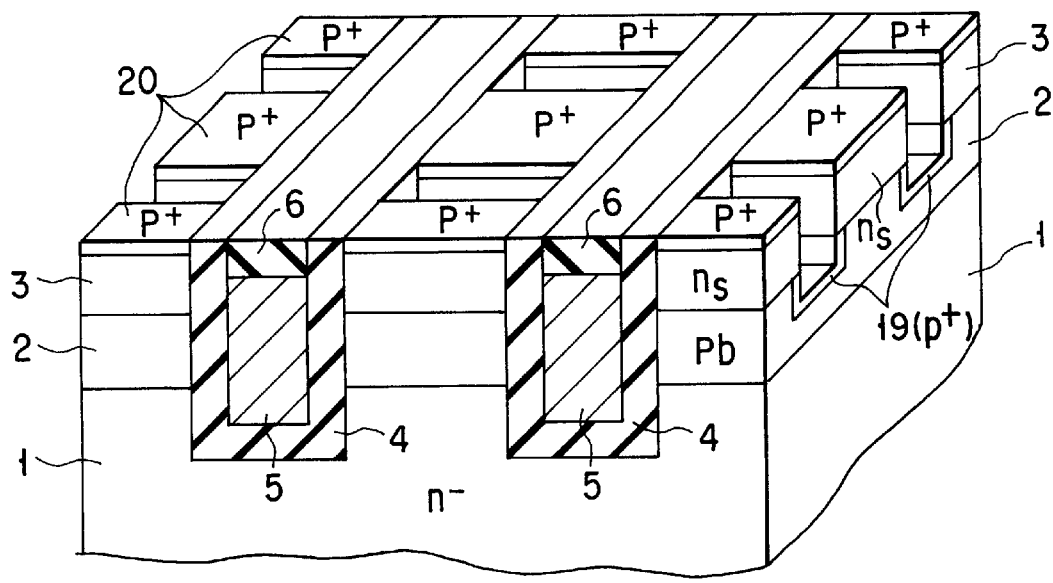

An eighth embodiment of the present invention will now be described with reference to FIGS. 10A and 10B. FIGS. 10A and 10B are perspective views of a device of a trench-MOS gate structure in a process of manufacturing the device.

First, the semiconductor structure shown in FIG. 1D referred to in the explanation of the first embodiment is formed. Specifically, a p-type base layer 2 is formed by impurity diffusion in a surface portion of an n-type high-resistance substrate 1, and an n-type source layer 3 is formed by impurity diffusion in an entire surface portion of the p-type base layer 2 (refer to FIG. 1A). Thereafter, trenches for MOS gates, which penetrate the n-type source layer 3 and the p-type base layer 2 and communicate with the n-type high-resistance substrate 1, are formed, and the entire surface of the substrate 1 including the trench is covered with a gate insulating film 4 (refer to FIG. 1A). Thereafter, gate electrodes 5 are buried in the trench, and then an insulating film 6 is deposited to cover the gate electrode 5 (refer to FIG. 1A). Thereafter, the insulating film 6 and the gate insulating film 4 on the surface of the substrate 1 are etched and removed by using RIE and CMP, etc. until the surface of the n-type source layer 3 is exposed (refer to FIG. 1B).

Thereafter, a plurality of resist patterns 7 are formed on the surface of the substrate 1 (refer to FIG. 1C). Then, by using the resist patterns 7 as masks, the n-type source layer 3 and the p-type base layer 2 are selectively etched by using, for example, RIE, to form a plurality of trenches for contact in the n-type source layer 3 and p-type base layer 2, which extend perpendicular to the gate electrodes 5 (FIG. 1D).

In the eighth embodiment, then, as shown in FIG. 10A, boron is ion-implanted in the entire surface of the substrate 1 without using any mask. Then, by annealing the resultant structure at a high-temperature, as shown in FIG. 10B, p-type contact layers 19 are formed on the surface regions of the trenches for contact of the p-type base layer 2, and p-type block layers 20 are formed on the surface regions of the n-type source layer 3. The p-type contact layers 19 and the p-type block layers 20 have an impurity concentration higher than the p-type base layer 2. Thereafter, though it is not shown in FIG. 10B, as shown in FIG. 4, an emitter electrode 10 is formed on the surface of the substrate 1. In the eighth embodiment, by forming the p-type contact layers 19, the contact resistance between the emitter electrode 10 and the p-type base layer 2 is reduced. Therefore, when this structure is used for an IGBT, since the discharge resistance of holes can be reduced, a latch-up withstand level can be improved. Further, since the p-type block layers 20 can prevent contact of the emitter electrode 10 and the n-type source layer 3 on the surface of the substrate, the contact resistance can be enlarged. Therefore, when a large amount of current runs through the device, there can be expected a feed back effect that a potential of the n-type source layer 3 is increased in order to lower gate voltage to be substantially applied and the current is reduced. Further, the latch-up withstand level can be improved by controlling rise of the potential of the p-type base layer 2. This technique that, as shown in FIG. 10B, p-type contact layers 19 are formed on the surface regions of the trenches for contact of the p-type base layer 2, and p-type block layers 20 are formed on the surface regions of the n-type source layer 3, can be applied to all of the embodiments of the present invention.

A ninth embodiment of the present invention will now be described with reference to FIG. 11. FIG. 11 is a cross-sectional view of a device of a trench-MOS gate structure in a process of manufacturing the device.

First, the semiconductor structure shown in FIG. 1A referred to in the explanation of the first embodiment is formed. Specifically, a p-type base layer 2 is formed by impurity diffusion in a surface portion of an n-type high-resistance substrate 1, and then an n-type source layer 3 is formed by impurity diffusion in an entire surface portion of the p-type base layer 2 (refer to FIG. 1A). Thereafter, trench for MOS gates, which penetrate through the n-type source layer 3 and p-type base layer 2 and communicate with the n-type high-resistance substrate 1, are formed, and then the entire surface of the substrate 1 including the trench is covered by a gate insulating film 4 (refer to FIG. 1A). Thereafter, gate electrodes 5 are buried in the trench, and then an insulating film 6 is deposited to cover the gate electrode 5 (refer to FIG. 1A). Then, a part of the insulating film 6 is selectively protected by a resist pattern 7, in other words, a part of the trench gate is selectively protected by a resist pattern 7, and the insulating film 6 and the gate insulating film 4 on the surface of the substrate 1 is etched and removed by using RIE and CMP, etc. until the surface of the n-type source layer 3 is exposed. At this time, though a margin for aligning a mask of the trench gate and a mask for the insulating film to be protected is required, scale down of the device is possible by designing only parts requiring a margin so as to have a large width and designing parts requiring no margin so as to have a small width. Using this structure enables to form a p-type base layer 2 which does not connect to the emitter electrode 10, and to form an IEGT (Injection Enhanced Gate Transistor: M. Kitagawa et al., IEEE IEDM Technical Digest (1993), pp. 679–682) having a structure wherein the on-state resistance can be reduced by using the storage effect of holes while a high withstand voltage is achieved.

As described above, according to the present invention, a trench-MOS gate structure can be formed without mask alignment which was required twice in a conventional art. Therefore, scale down of the device becomes possible and the device property is improved. Further, in the case of an IGBT, since the discharge resistance of holes can be reduced, the latch-up withstand level of the device can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first conductivity-type base layer;
   a second conductivity-type base layer formed on the first conductivity-type base layer;
   a first conductivity-type source layer formed on the second conductivity-type base layer;
   a plurality of first trenches formed in parallel to each other, which penetrate from a surface of the first conductivity-type source layer through the first conductivity-type source layer and the second conductivity-type base layer and reach the first conductivity-type base layer;
   gate insulating films formed on wall surfaces of the first trenches;
   gate electrodes formed within the first trenches and on the second conductivity-type base layer via the gate insulating films;
   a plurality of second trenches which penetrate from the surface of the first conductivity-type source layer through the first conductivity-type source layer and reach the second conductivity-type base layer; and
   a first main electrode formed within the second trenches and electrically connected to the first conductivity-type source layer and the second conductivity-type base layer,
   wherein portions of the second trenches and portions of the first conductivity-type source layer are alternately arranged in regions among the first trenches.

2. A semiconductor device according to claim 1, further comprising second conductivity-type contact layers formed in surface portions of the second conductivity-type base layer defining the second trenches, the second conductivity-type contact layers having an impurity concentration higher than the second conductivity-type base layer.

3. A semiconductor device according to claim 1, further comprising second conductivity-type contact layers formed in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

4. A semiconductor device comprising:
   a first conductivity-type base layer;
   a second conductivity-type base layer formed on the first conductivity-type base layer;
   a first conductivity-type source layer formed on the second conductivity-type base layer;
   a plurality of first trenches formed in parallel to each other, which penetrate from a surface of the first conductivity-type source layer through the first conductivity-type source layer and the second conductivity-type base layer and reach the first conductivity-type base layer;
   gate insulating films formed on wall surfaces of the first trenches;
   gate electrodes formed within the first trenches and on the second conductivity-type base layer via the gate insulating films;
   a plurality of second trenches which penetrate from the surface of the first conductivity-type source layer through the first conductivity-type source layer and reach the second conductivity-type base layer;
   a first main electrode formed within the second trenches and electrically connected to the first conductivity-type source layer and the second conductivity-type base layer;
   a high impurity concentration base layer and a second conductivity-type collector layer superposed on a surface of the first conductivity-type base layer, which surface is opposed to a surface thereof on which the second conductivity-type base layer is formed, the high impurity concentration base layer having an impurity concentration higher than the first conductivity-type base layer and being of the first conductivity-type; and a second main electrode formed on the second conductivity-type collector layer, wherein portions of the second trenches and portions of the first conductivity-type source layer are alternately arranged in regions among the first trenches.

5. A semiconductor device according to claim 4, further comprising second conductivity-type contact layers formed in surface portions of the second conductivity-type base layer defining the second trenches, the second conductivity-type contact layers having an impurity concentration higher than the second conductivity-type base layer.

6. A semiconductor device according to claim 4, further comprising second conductivity-type contact layers formed in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

7. A semiconductor device comprising:

a first conductivity-type base layer;

a second conductivity-type base layer formed on the first conductivity-type base layer;

a first conductivity-type source layer formed on the second conductivity-type base layer;

a plurality of first trenches formed in parallel to each other, which penetrate from a surface of the first conductivity-type source layer through the first conductivity-type source layer and the second conductivity-type base layer and reach the first conductivity-type base layer;

gate insulating films formed on wall surfaces of the first trenches;

gate electrodes formed within the first trenches and on the second conductivity-type base layer via the gate insulating films;

a plurality of second trenches which penetrate from the surface of the first conductivity-type source layer through the first conductivity-type source layer and reach the second conductivity-type base layer;

a first main electrode formed within the second trenches and electrically connected to the first conductivity-type source layer and the second conductivity-type base layer;

a drain layer formed on a surface of the first conductivity-type base layer, which surface is opposed to a surface thereof on which the second conductivity-type base layer is formed, the drain layer having an impurity concentration higher than the first conductivity-type base layer and being of the first conductivity-type; and a second main electrode formed on the drain layer, wherein portions of the second trenches and portions of the first conductivity-type source layer are alternately arranged in regions among the first trenches.

8. A semiconductor device according to claim 7, further comprising second conductivity-type contact layers formed in surface portions of the second conductivity-type base layer defining the second trenches, the second conductivity-type contact layers having an impurity concentration higher than the second conductivity-type base layer.

9. A semiconductor device according to claim 7, further comprising second conductivity-type contact layers formed in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

10. A semiconductor device comprising:

a first conductivity-type base layer;

a second conductivity-type base layer formed on the first conductivity-type base layer;

a first conductivity-type source layer formed on the second conductivity-type base layer;

a plurality of first trenches formed in parallel to each other, which penetrate from a surface of the first conductivity-type source layer through the first conductivity-type source layer and the second conductivity-type base layer and reach the first conductivity-type base layer;

gate insulating films formed on wall surfaces of the first trenches;

gate electrodes formed within the first trenches and on the second conductivity-type base layer via the gate insulating films;

a plurality of second trenches which penetrate from the surface of the first conductivity-type source layer through the first conductivity-type source layer and reach the second conductivity-type base layer;

a first main electrode formed within the second trenches and electrically connected to the first conductivity-type source layer and the second conductivity-type base layer;

a high impurity concentration base layer formed on the first conductivity-type base layer, the high impurity concentration base layer being separated from the second conductivity-type base layer, the high impurity concentration base layer having an impurity concentration higher than the first conductivity-type base layer and being of the first conductivity-type;

a second conductivity-type collector layer formed on the high impurity concentration base layer; and a second main electrode formed on the second conductivity-type collector layer, wherein portions of the second trenches and portions of the first conductivity-type source layer are alternately arranged in regions among the first trenches.

11. A semiconductor device according to claim 10, further comprising second conductivity-type contact layers formed in surface portions of the second conductivity-type base layer defining the second trenches, the second conductivity-type contact layers having an impurity concentration higher than the second conductivity-type base layer.

12. A semiconductor device according to claim 10, further comprising second conductivity-type contact layers formed in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

13. A semiconductor device comprising:

a first conductivity-type base layer;

a second conductivity-type base layer formed on the first conductivity-type base layer;

a first conductivity-type source layer formed on the second conductivity-type base layer;

a plurality of first trenches formed in parallel to each other, which penetrate from a surface of the first conductivity-type source layer through the first conductivity-type source layer and the second conductivity-type base layer and reach the first conductivity-type base layer;

gate insulating films formed on wall surfaces of the first trenches;

gate electrodes formed within the first trenches and on the second conductivity-type base layer via the gate insulating films;

a plurality of second trenches which penetrate from the surface of the first conductivity-type source layer through the first conductivity-type source layer and reach the second conductivity-type base layer;

a first main electrode formed within the second trenches and electrically connected to the first conductivity-type source layer and the second conductivity-type base layer;

a drain layer formed on the first conductivity-type base layer, the drain layer being separated from the second conductivity-type base layer, the drain layer having an impurity concentration higher than the first conductivity-type base layer and being of the first conductivity-type; and a second main electrode formed on the drain layer, wherein portions of the second trenches and portions of the first conductivity-type source layer are alternately arranged in regions among the first trenches.

14. A semiconductor device according to claim 13, further comprising second conductivity-type contact layers formed in surface portions of the second conductivity-type base layer defining the second trenches, the second conductivity-type contact layers having an impurity concentration higher than the second conductivity-type base layer.

15. A semiconductor device according to claim 13, further comprising second conductivity-type contact layers formed in surface portions of the second conductivity-type base layer defining the second trenches and second conductivity-type block layers formed in surface portions of the first conductivity-type source layer, the second conductivity-type contact layers and the second conductivity-type block layers having an impurity concentration higher than the second conductivity-type base layer.

* * * * *